(12) United States Patent
Gu et al.

(10) Patent No.: US 8,836,831 B2
(45) Date of Patent: Sep. 16, 2014

(54) IMAGE SENSOR

(75) Inventors: Ren Hau Gu, Hsinchu (TW); Chih Hsin Lin, Hsinchu (TW); Wen Han Yao, Hsinchu (TW); Hung Ching Lai, Hsinchu (TW); Shu Sian Yang, Hsinchu (TW); Yu Hao Huang, Hsinchu (TW); Chih Hung Lu, Hsinchu (TW); En Feng Hsu, Hsinchu (TW); Chi Chieh Liao, Hsinchu (TW)

(73) Assignee: Pixart Imaging Inc., Hsin-Chu (TW)

( * ) Notice: Subject to any disclaimer, the term of this patent is extended or adjusted under 35 U.S.C. 154(b) by 272 days.

(21) Appl. No.: 13/400,318

(22) Filed: Feb. 20, 2012

(65) Prior Publication Data

US 2012/0212639 A1 Aug. 23, 2012

(30) Foreign Application Priority Data

Feb. 23, 2011 (TW) .............................. 100105928 A

(51) Int. Cl.
*H04N 5/335* (2011.01)
*H04N 5/3745* (2011.01)
*H04N 5/353* (2011.01)
*H01L 27/146* (2006.01)

(52) U.S. Cl.
CPC ..... *H01L 27/14643* (2013.01); *H01L 27/14678* (2013.01); *H04N 5/3745* (2013.01); *H04N 5/353* (2013.01)

USPC .......................................... 348/296; 348/308

(58) Field of Classification Search
CPC ........................... H04N 5/2329; H04N 5/2353
USPC ......................................... 348/308, 296, 297
See application file for complete search history.

(56) References Cited

U.S. PATENT DOCUMENTS

| | | | |
|---|---|---|---|
| 7,129,979 B1 | 10/2006 | Lee | |
| 7,223,956 B2 | 5/2007 | Yoshida | |
| 7,911,518 B2* | 3/2011 | Yosefin | 348/273 |
| 2004/0233310 A1 | 11/2004 | Egawa et al. | |
| 2006/0164529 A1* | 7/2006 | Shimizu | 348/308 |

OTHER PUBLICATIONS

Office Action from the Taiwanese Patent Office with corresponding, Taiwan Application No. 10221419790, mailed Oct. 23, 2013, p. 1-9.

* cited by examiner

*Primary Examiner* — Tuan Ho
(74) *Attorney, Agent, or Firm* — Juan Carlos A. Marquez; Bacon & Thomas LLP

(57) ABSTRACT

An image sensor includes a sensor matrix including a plurality of sensing elements and a plurality of shutter control lines. Each sensing element includes an electronic shutter and a photo-detector, wherein the electronic shutter controls the exposure time of the photo-detector. Each shutter control line couples to a row or column of the electronic shutters, whereby different rows or columns of the electronic shutters can be independently controlled, and the photo-detectors in the same row or column can have the same exposure time.

15 Claims, 7 Drawing Sheets

FIG. 1 -- Prior Art --

-- Prior Art --

IMAGE SENSOR

CROSS-REFERENCE TO RELATED APPLICATION

The present application is based on, and claims priority from, Taiwan (International) Application Serial Number 100105928, filed on Feb. 23, 2011, the disclosure of which is hereby incorporated by reference herein in its entirety.

BACKGROUND

1. Technical Field

The present invention relates to an image sensor, and relates more particularly, but not exclusively, to an image sensor that is capable of compensating variations of light sources.

2. Related Art

Image sensors can convert light into electrical charges and process the electrical charges to output digital electronic signals constituting an image. The digital electronic signals can be stored in a storage medium or output to a display device, forming an image on a screen. Therefore, image sensors are convenient to use. Due to their convenience, image sensors have been applied in many electronic apparatuses such as digital cameras, digital video cameras, cell phones, optical mice, etc.

Generally, an image sensor may comprise a semiconductor device, which may be a charge-coupled device or a complementary metal oxide semiconductor device. An image sensor usually includes pixels arranged in a matrix. When exposed to light, pixels generate electrical charges or electrical voltages representing image information. The electrical charges or electrical voltages stored in the pixels can be sequentially output by shift registers coupling to the pixels.

Image sensors can also be used in touch control systems. FIG. 1 demonstrates an optical touch system 1. As shown in FIG. 1, the optical touch system 1 comprises two elongated light guide members 11, a plurality of light emitting diodes 12, and an image sensor 13. The light guide members 11 are respectively disposed on two adjacent sides of a sensing area 14. The plurality of light emitting diodes 12 are disposed adjacent to the ends of the light guide members 11, projecting light to the sensing area 14 through the light guide members 11. The image sensor 13 is disposed opposite the light guide members 11.

FIG. 2 is a diagram showing a luminous intensity distribution of a background image captured by an image sensor 13. Referring to FIGS. 1 and 2, in the optical touch system 1, background light incident on the image sensor 13 is not uniformly distributed. Non-uniformly distributed luminous intensity may result in disadvantages: pixels exposed to strong light may accumulate charges quickly, causing the pixels to be easily saturated, adversely affecting the identification of an image object; inaccurate calculations of the centers of mass of object images can easily occur due to low signal-to-noise ratios in low luminous intensity regions; and inaccurate calculations of the centers of mass of object images may occur if the object image is at a large slope section of the curve of FIG. 2.

Normalizing the luminous intensity curve of FIG. 2 using software to obtain a curve with more uniformly distributed luminous intensity is a commonly adopted method. Although such method may prevent the calculation of the mass centers of image objects from being affected by non-uniformly distributed luminous intensity, the issue of the inaccurate calculation of the mass center of an object image in a low luminous intensity region still exists.

SUMMARY

In accordance with the above issues, an image sensor that can produce an image with uniform background luminous intensity distribution is disclosed.

In accordance with the above objective, one embodiment of the present invention discloses an image sensor, which comprises a sensor matrix and a plurality of shutter control lines. The sensor matrix comprises a plurality of sensing elements. Each sensing element comprises a photo-detector and an electronic shutter. The electronic shutter is configured to control exposure time of the photo-detector. Each shutter control line is configured to couple to a row or column of the electronic shutters. As such, different rows or columns of the photo-detectors can be independently controlled, and the photo-detectors coupling to the same shutter control line can have the same exposure time.

In another embodiment of the present invention, an image sensor comprises at least one column or row of sensing elements, a plurality of electronic shutters, and a memory device. Each sensing element comprises a photo-detector. Each electronic shutter is coupled with a corresponding photo-detector. The memory device comprises a plurality of computer-readable clock instructions. The plurality of computer-readable clock instructions are configured to generate a plurality of corresponding shutter control signals. The plurality of corresponding shutter control signals are each configured to control a single electronic shutter.

In another embodiment of the present invention, an image sensor capturing an image for a predetermined exposure time comprises at least one column or row of sensing elements, a plurality of electronic shutters, and an image processor. Each sensing element comprises a photo-detector. Each electronic shutter is coupled to a corresponding photo-detector. The image processor electrically couples to the sensing elements to obtain output signals from the sensing elements and generates corresponding sensing signals. The shutter activation times of the electronic shutters are controlled according to the respective sensing signals.

In another embodiment of the present invention, an image sensor comprises at least one row of sensing elements, a plurality of electronic shutters, and an image processor. Each sensing element comprises a photo-detector. Each electronic shutter is coupled to a corresponding photo-detector. The image processor electrically couples to the sensing elements to obtain output signals from the sensing elements and generates corresponding sensing signals representing luminosity values received by the sensing elements. The shutter activation times of the electronic shutters are controlled according to the luminous intensity values received by the sensing elements so as to ensure that the luminosity values of a background image captured by the image sensor fall within a predetermined luminosity range.

To better understand the above-described objectives, characteristics and advantages of the present invention, embodiments, with reference to the drawings, are provided for detailed explanations.

BRIEF DESCRIPTION OF THE DRAWINGS

The invention will be described according to the appended drawings in which.

DETAILED DESCRIPTION OF DISCLOSED EMBODIMENTS

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the disclosed embodiments. Thus, the disclosed embodiments are not limited to the embodiments shown, but are to be accorded the widest scope consistent with the principles and features disclosed herein.

The data structures and code described in this detailed description are typically stored on a non-transitory computer-readable storage medium, which may be any device or medium that can store code and/or data for use by a computer system. The non-transitory computer-readable storage medium includes, but is not limited to, volatile memory, non-volatile memory, magnetic and optical storage devices such as disk drives, magnetic tape, CDs (compact discs), DVDs (digital versatile discs or digital video discs), or other media capable of storing code and/or data now known or later developed.

The methods and processes described in the detailed description section can be embodied as code and/or data, which can be stored in a non-transitory computer-readable storage medium as described above. When a computer system reads and executes the code and/or data stored on the non-transitory computer-readable storage medium, the computer system performs the methods and processes embodied as data structures and code and stored within the non-transitory computer-readable storage medium. Furthermore, the methods and processes described below can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules perform the methods and processes included within the hardware modules.

Figure 3:
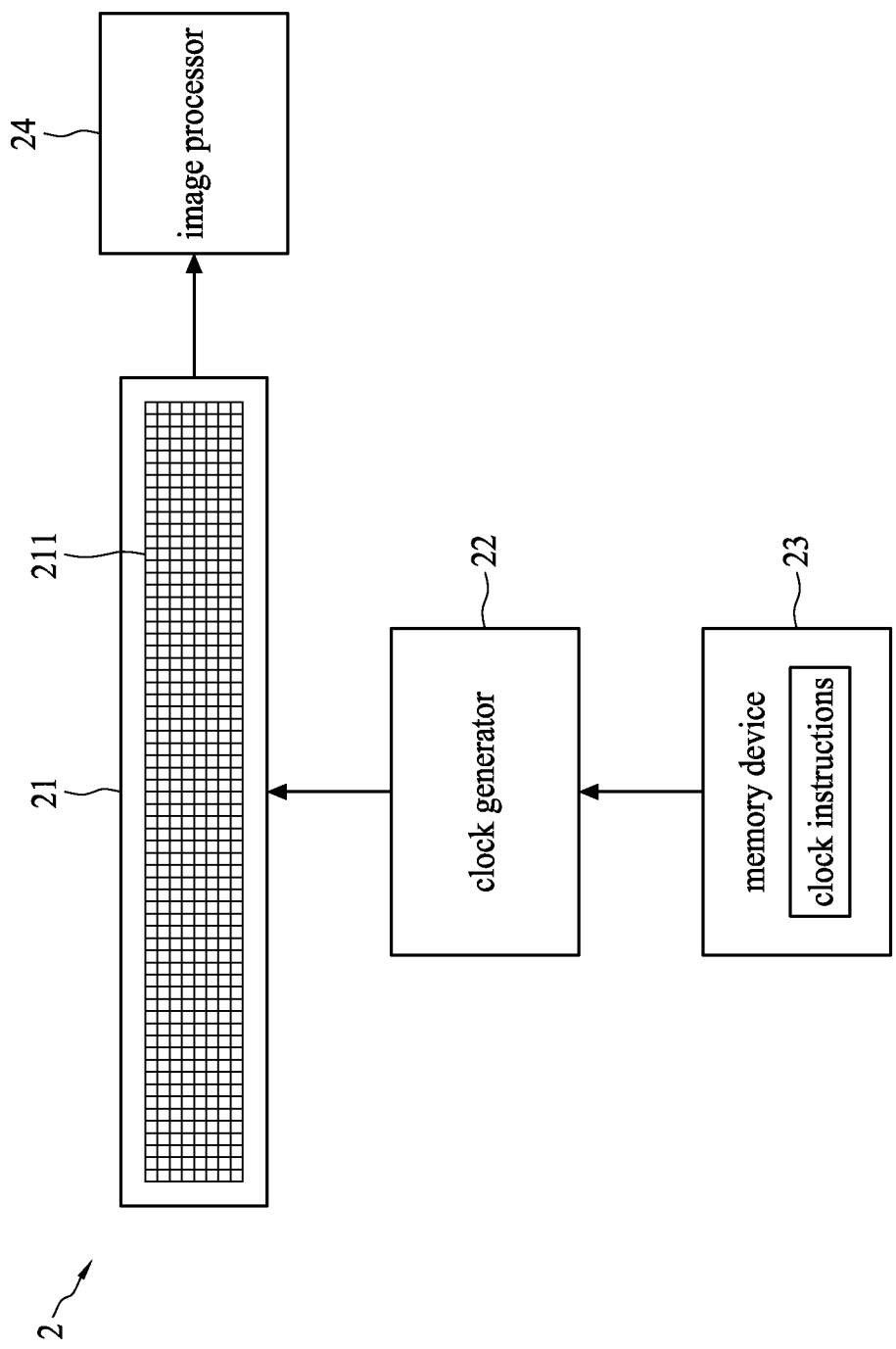
FIG. 3 is a block diagram schematically showing an image sensor according to one embodiment of the present invention.
Figure 4:
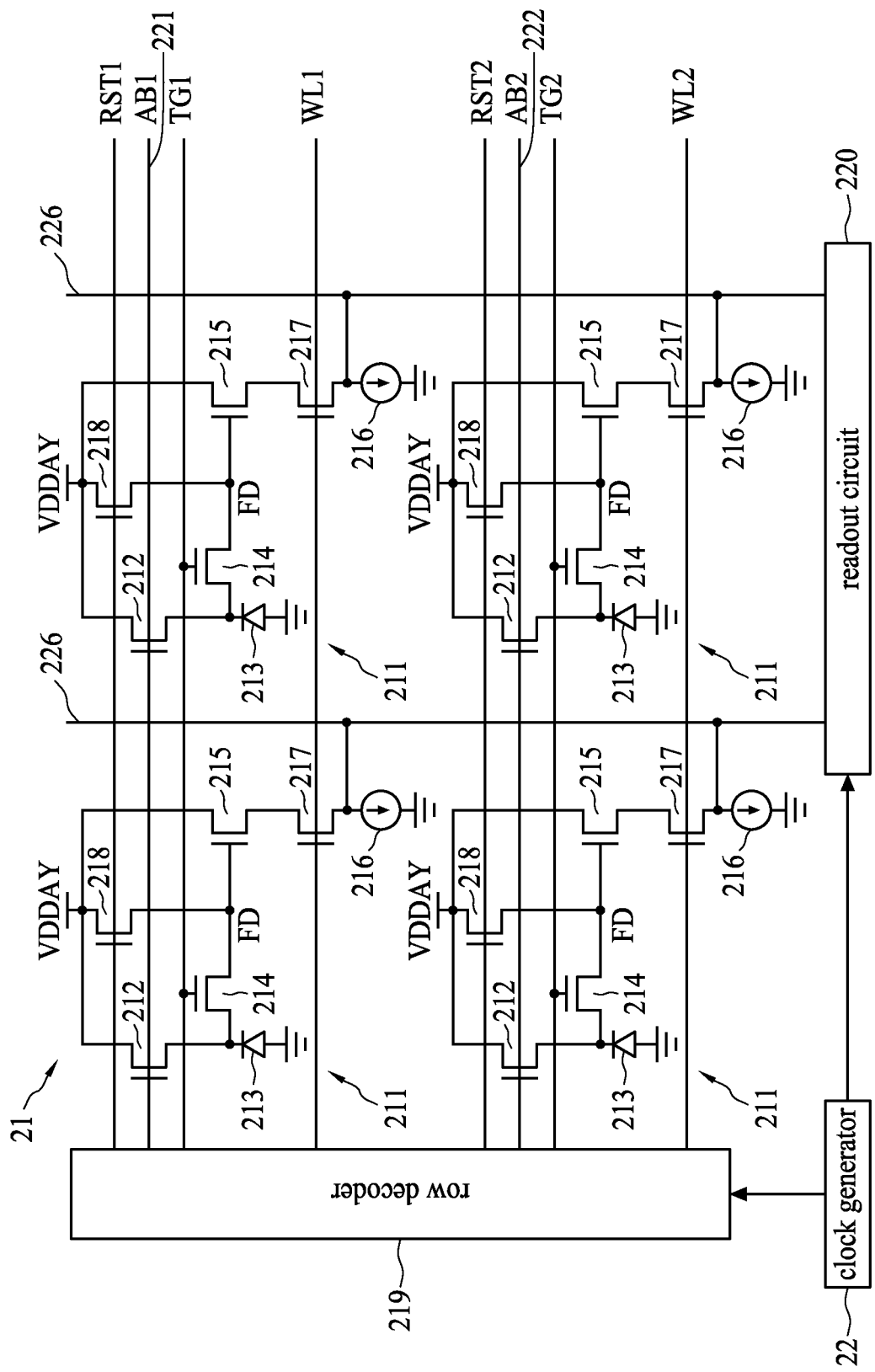
FIG. 4 schematically demonstrates a portion of sensing elements and a control circuit thereof according to one embodiment of the present invention.

FIG. 3 is a block diagram schematically showing an image sensor 2 according to one embodiment of the present invention. FIG. 4 is a diagram showing a portion of sensing elements 211 in the image sensor 2 and a control circuit thereof according to one embodiment of the present invention. Referring to FIG. 3, the image sensor 2 comprises a sensor matrix 21, a clock generator 22, a memory device 23, and an image processor 24. The sensor matrix 21 comprises a plurality of sensing elements 211, which are arranged along horizontal and vertical directions to form a matrix. As shown in FIG. 4, each sensing element 211 comprises an electronic shutter 212 and a photo-detector 213. The electronic shutter 212 couples to the photo-detector 213 for controlling the exposure time of the photo-detector 213. As shown in FIG. 3, the clock generator 22 is configured to provide clock signals needed by the sensing elements 211 when the sensing elements 211 capture images, wherein the clock signal may comprise a shutter control signal. The memory device 23 may couple to the clock generator 22 and is configured to store computer-readable clock instructions, by which the clock generator 22 generates the shutter control signals. The clock instructions are changeable, causing the shutter control signals to be adjustable so as to control the exposure time of the corresponding electronic shutters 212. The image processor 24 may couple to the sensor matrix 21. The image processor 24 may electrically connect to the sensing elements 211, thereby obtaining the signals outputted from the sensing elements 211 to generate corresponding sensing signals. The image sensor 2 is configured so that the activation time of the electronic shutter 212 is controlled according to the strength of the sensing signal generated from the corresponding sensing element 211, and thereby the sensing elements 211 can output more uniform signals representing background intensity.

In another embodiment of the present invention, the memory device 23 can be arranged in the clock generator 22.

Referring to FIG. 4, the sensing elements 211 in the image sensor 2 can be arranged in a matrix. In each sensing element 211, the photo-detector 213 generates charges according to received light amount. The transistor 214 controls the transfer of generated charges to an FD (floating diffusion) output node. A transistor 215 and a constant current source 216 constitute a source follower, which amplifies the photovoltaic voltage generated by the photo-detector 213. A transistor 217 is configured to output data onto a bit line 226. When signals (RST1 or RST2) and (TG1 or TG2) go high, the transistors 214 and 218 are activated such that a voltage source VDDAY can reset the photo-detector 213 to a photo-electric conversion initiation state. When the transistor 214 is turned on, charges flow from the photo-detector 213 to the FD output node. When the signal RST1 or RST2 goes high, the voltage source VDDAY resets the FD output node.

In another embodiment, each sensing element 211 may comprise a plurality of photo-detectors 213 and a plurality of corresponding electronic shutters 212, wherein the electronic shutters 212 respectively control the exposure time of the photo-detectors 213.

In another embodiment, the electronic shutter 212 may be a transistor. The electronic shutter 212 is connected in series between the voltage source VDDAY and the photo-detector 213. When the control signal AB1 or AB2 goes high, the voltage source VDDAY resets the photo-detector 213 so as to maintain the photo-detector 213 in the photo-electric conversion initiation state. When an exposure cycle is started, the shutter control signal AB1 or AB2 goes low and the photo-detector 213 starts to use light to generate electricity. By adjusting the time of the activation or deactivation of the electronic shutter 212, the exposure time of the photo-detector 213 can be controlled.

A row decoder 219 provides reset signals (RST1 and RST2), signals (TG1 and TG2), signals (AB1 and AB2), and word-line readout control signals (WL1 and WL2). A readout circuit 220 is configured to obtain image information from the sensing elements 211. The readout circuit 220 may be coupled to a decoder for receiving column selection signals. The clock generator 22 is configured to provide clock signals for the row decoder 219 and the readout circuit 220.

In particular, the image sensor 2 may comprise a plurality of shutter control lines 221 and 222. As shown in FIG. 4, each shutter control line 221 or 222 is coupled to the electronic shutters 212 of the sensing elements 211 in the sensor matrix 21, arranged along the same transverse direction (a row direction) such that the photo-detectors 213 arranged in the same transverse direction can be operated for the same exposure time. Further, a plurality of shutter control lines 221 and 222 are independent from each other. As a result, different shutter control signals can be respectively applied to different shutter control lines 221 and 222 as such that photo-detectors 213 connecting to different shutter control lines 221 and 222 can be operated for different exposure times.

Figure 1:
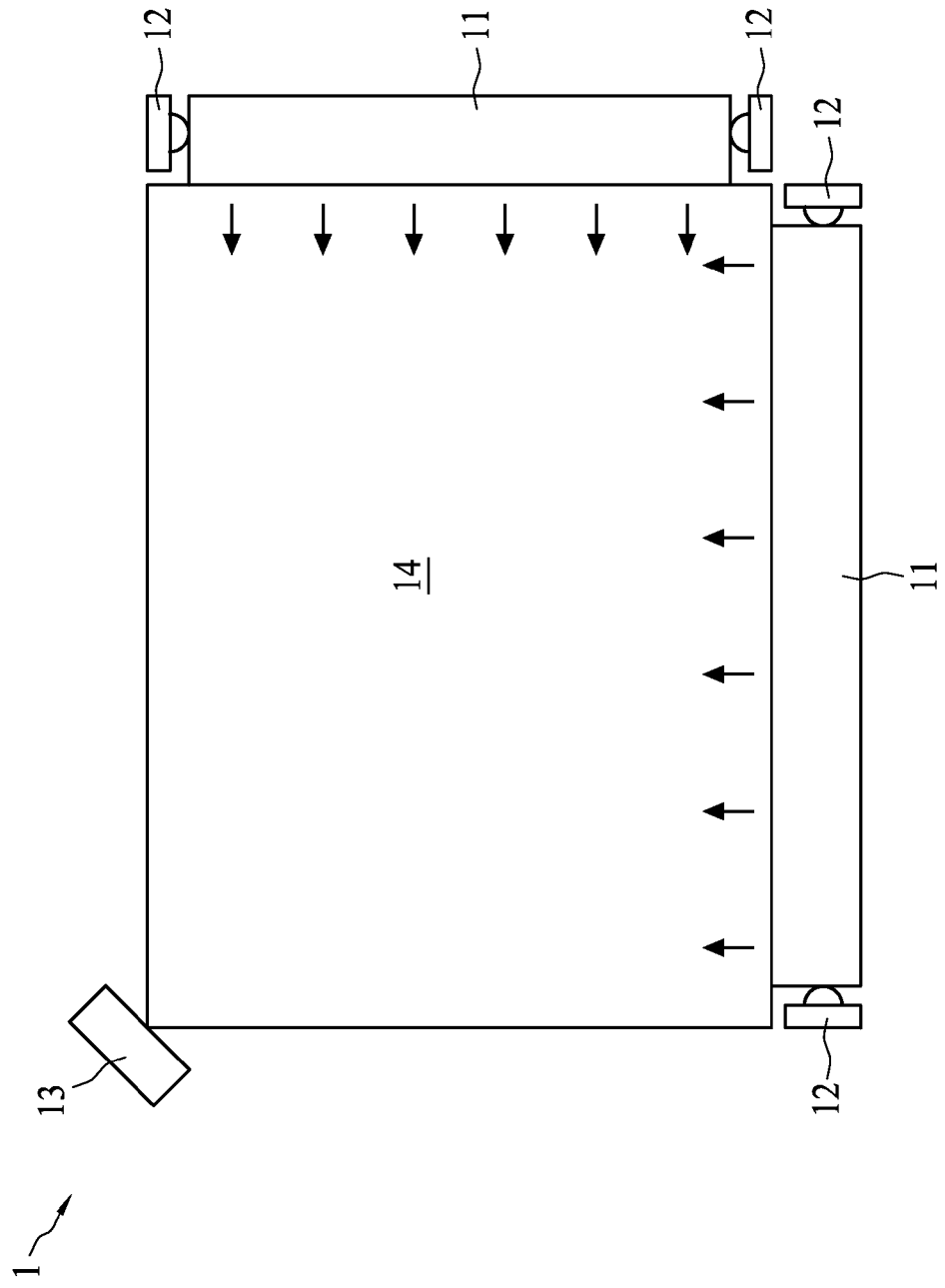
FIG. 1 demonstrates an optical touch system.
Figure 2:
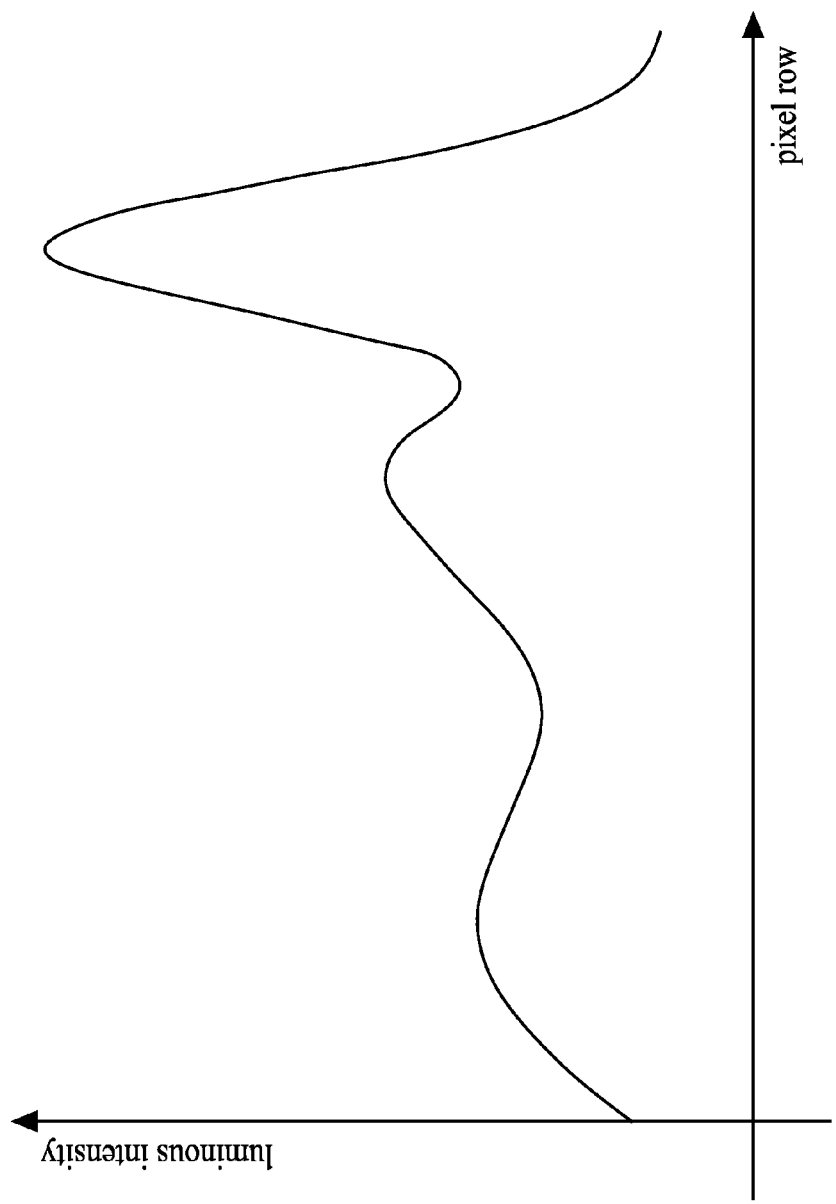
FIG. 2 is a diagram showing a luminous intensity distribution of a background image captured by an image sensor.
Figure 5:
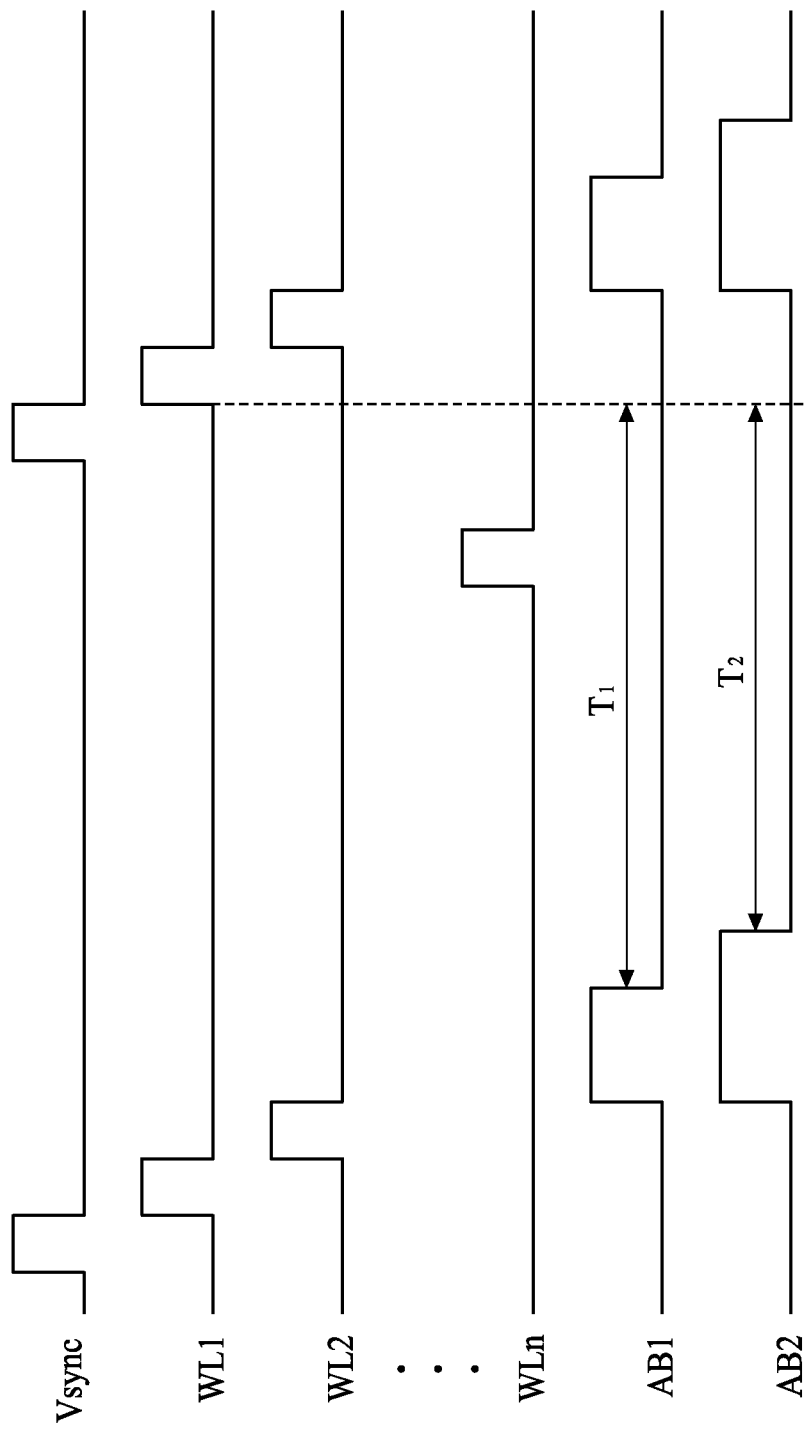
FIG. 5 shows a timing diagram of the operation of the image sensor of the embodiment in FIG. 4.

FIG. 5 shows a timing diagram of the operation of the image sensor 2 of the embodiment of FIG. 4, wherein the timing diagram shows the timing of a synchronous signal Vsync, the timing of word line readout control signals WL to WLn, and the timing of shutter control signals AB1 and AB2. Referring to FIGS. 1, 4 and 5, the memory device 23 may store clock instructions corresponding to the shutter control lines 221 and 222 such that shutter control signals AB1 and AB2 with different pulse widths can be generated and applied on different shutter control lines 221 and 222 as shown in FIG. 5. In the present embodiment, all photo-detectors 213 are operated at the same time and stop operation at the falling edge of the same synchronous signal Vsync. Thus, the adjustment of the pulse widths of shutter control signals AB1 and AB2 may cause the photo-detectors 213 arranged in different rows to be operated for different exposure times. In the embodiment of FIG. 5, because the pulse width of the shutter control signal AB1 is narrower than that of the shutter control signal AB2, the exposure time $T_1$, over which the photo-detectors 213 connected with the shutter control line 221 are exposed to light, is longer than the exposure time $T_2$, over which the photo-detectors 213 connected with the shutter control line 222 are exposed to light.

Figure 6:
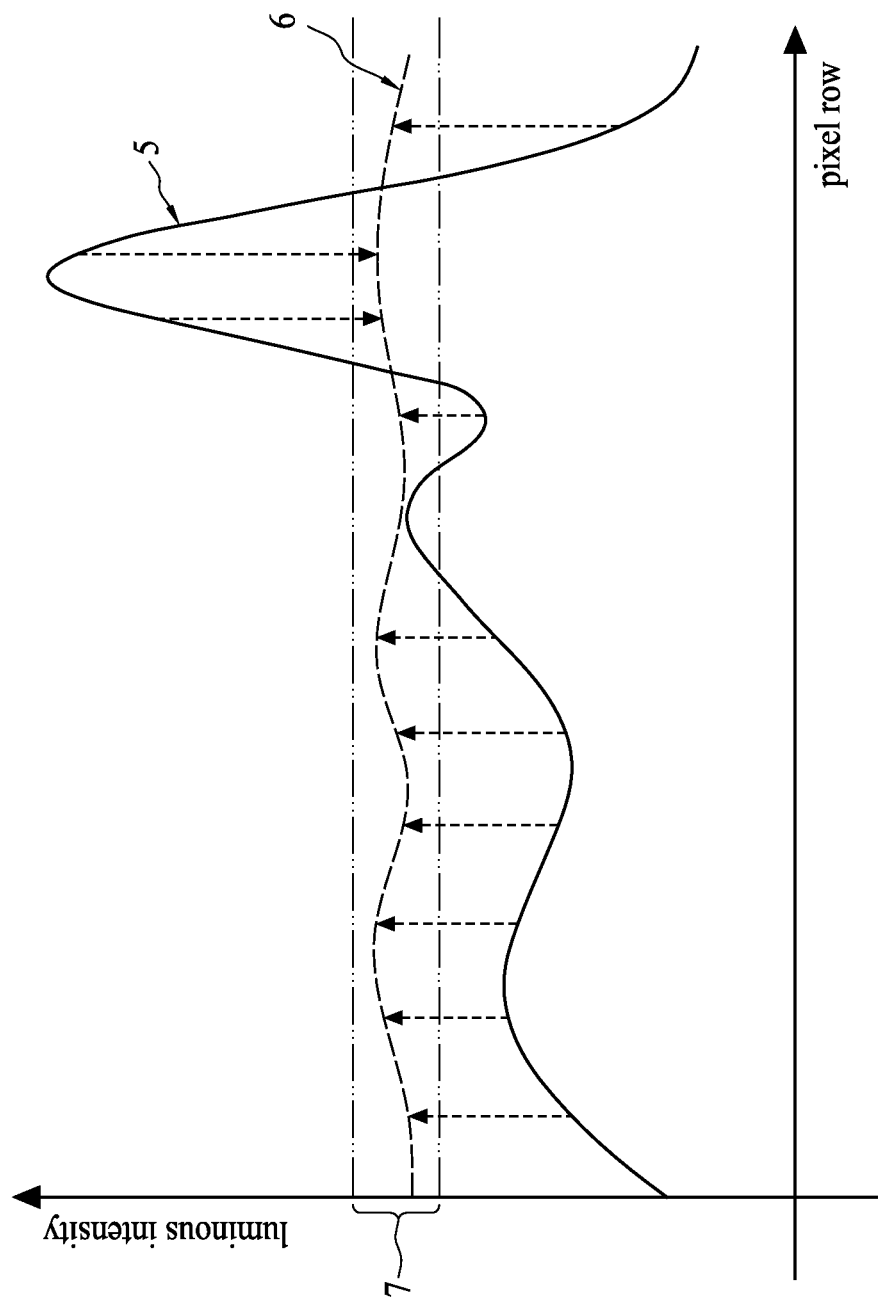
FIG. 6 is a schematic diagram showing luminous intensity distributions before and after the adjustment of exposure time of photo-detectors according to one embodiment of the present invention.

FIG. 6 is a schematic diagram showing luminous intensity distributions before and after the adjustment of exposure time of photo-detectors 213 according to one embodiment. The circuit configuration of FIG. 4 can provide compensation to reduce the variation of the luminous intensity distribution of the image, generated by the image sensor 2, caused by non-uniform background light. Referring to FIGS. 4 and 6, in a system, the image sensor 2 captures, over a predetermined exposure time, an image with a luminous intensity distribution presented as curve 5 in FIG. 6. The luminous intensity distribution curve 5 represents an average luminosity distribution along a direction, the column-wise direction in the present embodiment, transverse (or vertical) to the shutter control lines 221 and 222. Changes are made to the exposure time, such as reducing the exposure time of the photo-detectors 213 exposed to stronger background light (i.e. applying a shutter control signal with wider pulse width to the shutter control line 221 or 222, which connects to the photo-detectors 213 exposed to stronger background light) and extending the exposure time of the photo-detectors 213 exposed to weaker background light (i.e. applying a shutter control signal with narrower pulse width to the shutter control line 221 or 222, which connects to the photo-detectors 213 exposed to weaker background light). As a result, an image with uniform background luminous intensity distribution presented as curve 6 can be obtained, thereby achieving the effect of providing compensation to reduce the variation of the luminous intensity distribution.

In another embodiment, a predetermined luminosity range 7 can determine the exposure time of the photo-detectors 213 connecting to each shutter control line 221 or 222. As shown in FIG. 6, according to the luminous intensity distribution curve 5 and the predetermined luminosity range 7, the image sensor 2 can respectively calculate the exposure time of the photo-detectors 213 connecting to each shutter control line 221 or 222. For example, the exposure time can be calculated based on a ratio of a value, for example an intermediate value, in the predetermined luminosity range 7 to a luminous intensity value acquired according to an originally determined exposure time. The calculated exposure time can also cause the image sensor 2 to generate a background image with a luminous intensity distribution falling within the predetermined luminosity range 7.

In one embodiment, as shown in FIG. 3, the image processor 24 electrically connects to the sensing elements 211, and is thereby capable of acquiring output signals from the sensing elements 211. The image processor 24 can process the output signals to generate corresponding sensing signals, which represent the luminosity values sensed by the corresponding sensing elements 211.

Figure 7:
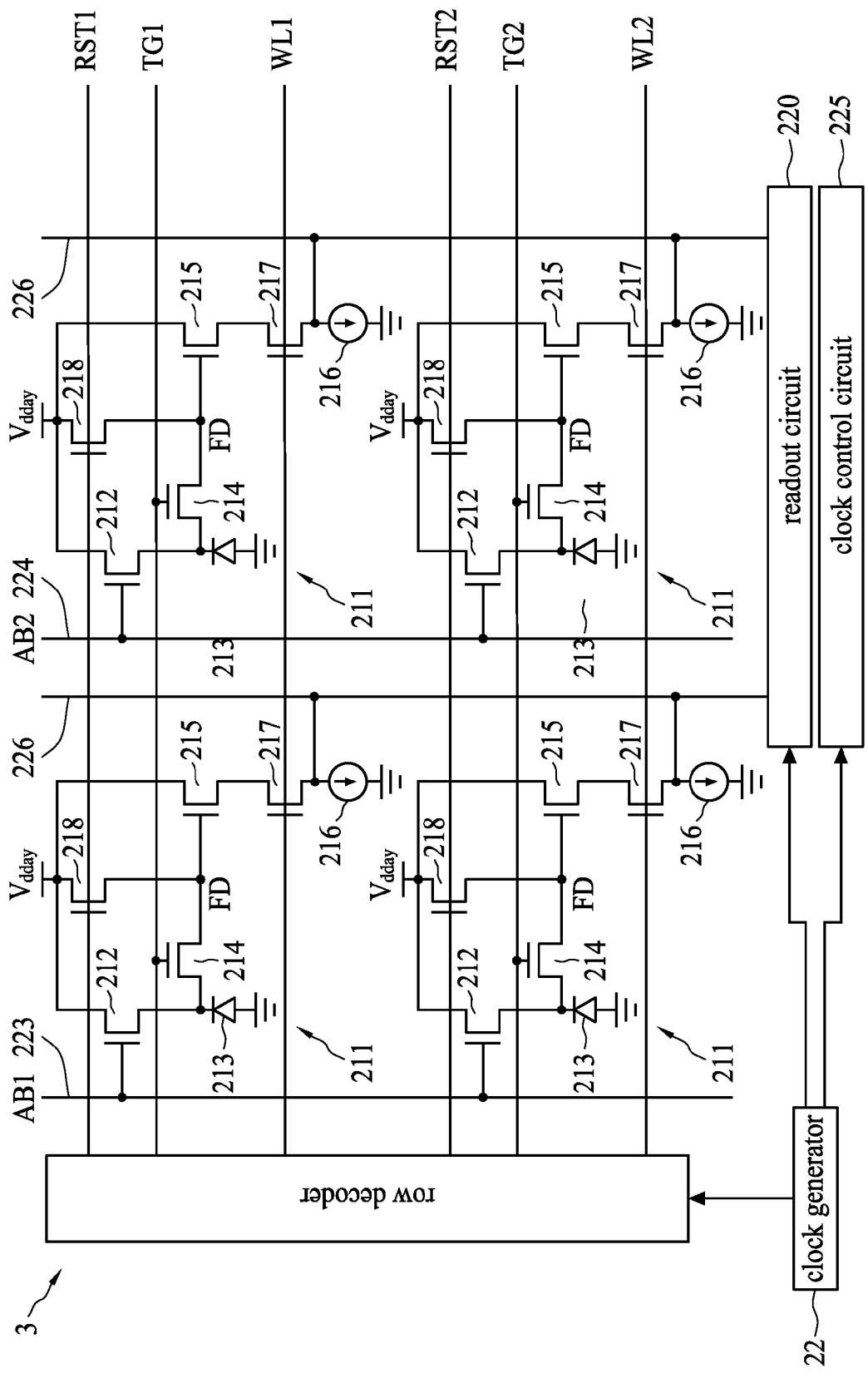
FIG. 7 is a schematic representation of the partial circuit of an image sensor according to another embodiment of the present invention.

FIG. 7 is a schematic representation of the partial circuit of an image sensor 3 according to another embodiment. Referring to FIG. 7, the image sensor 3 is similar to the image sensor 2 disclosed in FIG. 4 except that in the image sensor 3 the electronic shutters 212 of the sensing element 211 arranged in each column connect to a corresponding shutter control line 223 or 224. Thus, the electronic shutters 212 of the sensing element 211 in each column can be activated over the same exposure time, and the electronic shutters 212 of the sensing element 211 in different columns can be activated over different exposure times. The circuit configuration of the image sensor 3 can provide compensation for the variations of a light source in the row-wise direction so that the luminous intensity distribution of a captured image can be uniform or fall within a predetermined luminosity range. The shutter control lines 223 and 224 can be coupled to a clock control circuit 225, by which the clock generator 22 can provide a corresponding shutter control signal for each shutter control line 223 or 224.

In an image sensor, a shutter control line connects the electronic shutters in the same row or column. Different shutter control signals determined based on the background luminous intensity distribution of an image are applied to different shutter control lines such that the photo-detectors exposed to strong light are managed to operate over shorter exposure time and the photo-detectors exposed to weak light are managed to operate over longer exposure time. As a result, the issue wherein the photo-detectors exposed to strong light may accumulate charges faster and saturate easily, and the issue of the inaccurate calculation of the mass center of an object image in a low luminous intensity region may easily occur, can both be avoided. Further, the inaccurate calculation of the mass center of an object image, which is at the large slope section of the luminous intensity distribution curve, may be reduced.

It will be apparent to those skilled in the art that various modifications and variations can be made to the disclosed embodiments. It is intended that the specification and examples be considered as exemplary only, with a true scope of the disclosure being indicated by the following claims and their equivalent.

What is claimed is:
1. An image sensor comprising:
 a sensor matrix comprising a plurality of sensing elements, each sensing element comprising a photo-detector and an electronic shutter configured to control exposure time of the photo-detector;
 a plurality of shutter control lines each coupling to a row or column of the electronic shutters, whereby different rows or columns of the photo-detectors can be independently controlled, and the photo-detectors coupling to the same shutter control line can have the same exposure time; and a clock generator coupling to the shutter control lines, wherein the clock generator is configured to generate a plurality of shutter control signals corresponding to the shutter control lines, wherein the image sensor receives background light, wherein as the exposure time of each row or column of the photo-detectors increases, each row or column of the photo-detectors receives an increased amount of the background light.

2. The image sensor of claim 1, wherein each sensing element comprises a plurality of photo-detectors and a plurality of electronic shutters each configured to control exposure time of a corresponding one of the photo-detectors.

3. The image sensor of claim 1, wherein the electronic shutter comprises a transistor disposed between a corresponding one of the photo-detectors and a voltage source.

4. The image sensor of claim 1, further comprising a memory device storing a plurality of clock instructions configured to generate the shutter control signals.

5. An image sensor comprising:
- at least one column or row of sensing elements, each sensing element comprising a photo-detector;
- a plurality of electronic shutters, each coupling to a corresponding one of the photo-detectors;
- a memory device comprising a plurality of computer-readable clock instructions configured to generate a plurality of corresponding shutter control signals configured to control respectively the electronic shutters, and
- a clock generator coupling to the shutter control lines, the clock generator being configured to generate a plurality of shutter control signals corresponding to the shutter control lines, wherein the image sensor receives background light, wherein as the exposure time of each row or column of the photo-detectors increases, each row or column of the photo-detectors receives an increased amount of the background light.

6. The image sensor of claim 5, wherein each sensing element comprises a plurality of photo-detectors and a plurality of electronic shutters, each electronic shutter configured to control exposure time of a corresponding one of the photo-detectors.

7. The image sensor of claim 5, wherein the electronic shutter comprises a transistor disposed between a corresponding one of the photo-detectors and a voltage source.

8. The image sensor of claim 5, wherein the memory device is in the clock generator.

9. An image sensor capturing an image for a predetermined exposure time, the image sensor comprising:
- at least one column or row of sensing elements, each sensing element comprising a photo-detector;
- a plurality of electronic shutters, each coupling to a corresponding one of the photo-detectors;
- an image processor electrically coupling to the sensing elements to obtain output signals from the sensing elements and generating corresponding sensing signals; and
- a clock generator configured to generate a plurality of shutter control signals for controlling the electronic shutters, wherein shutter activation times of the electronic shutters are controlled according to the respective sensing signals, wherein the image sensor receives background light, wherein as the exposure time of each row or column of the photo-detectors increase, each row or column of the photo-detectors receive an increased amount of the background light.

10. The image sensor of claim 9, wherein each sensing element comprises a plurality of photo-detectors and a plurality of electronic shutters, each electronic shutter configured to control exposure time of a corresponding one of the photo-detectors.

11. The image sensor of claim 9, wherein the electronic shutter comprises a transistor disposed between a corresponding one of the photo-detectors and a voltage source.

12. The image sensor of claim 9, wherein the sensing signal comprises a luminous intensity value.

13. An image sensor comprising:
- at least one row of sensing elements, each sensing element comprising a photo-detector;
- a plurality of electronic shutters, each electronic shutter coupling to a corresponding one of the photo-detectors;
- an image processor electrically coupling to the sensing elements to obtain output signals from the sensing elements and generating corresponding sensing signals representing luminosity values received by the sensing elements; and
- a clock generator coupling to the electronic shutters to control the electronic shutters, wherein shutter activation times of the electronic shutters are controlled according to the luminous intensity values received by the sensing elements so as to ensure that the luminosity values of a background image captured by the image sensor fall within a predetermined luminosity range, wherein the image sensor receives background light, wherein as the exposure time of each row or column of the photo-detectors increase, each row or column of the photo-detectors receive an increased amount of the background light.

14. The image sensor of claim 13, wherein each sensing element comprises a plurality of photo-detectors and a plurality of electronic shutters, each electronic shutter configured to control exposure time of a corresponding one of the photo-detectors.

15. The image sensor of claim 13, wherein the electronic shutter comprises a transistor disposed between a corresponding one of the photo-detectors and a voltage source.

* * * * *